(12) United States Patent
Ang et al.

(10) Patent No.: US 8,742,957 B2
(45) Date of Patent: Jun. 3, 2014

(54) MULTI-VARIABLE MULTI-WIRE INTERCONNECT

(75) Inventors: Michael A. Ang, San Francisco, CA (US); Alan C. Rogers, Palo Alto, CA (US)

(73) Assignee: Analog Bits, Inc., Mountain View, CA (US)

( * ) Notice: Subject to any disclaimer, the term of this patent is extended or adjusted under 35 U.S.C. 154(b) by 1 day.

(21) Appl. No.: 13/327,264

(22) Filed: Dec. 15, 2011

(65) Prior Publication Data

US 2012/0154183 A1 Jun. 21, 2012

Related U.S. Application Data

(60) Provisional application No. 61/423,532, filed on Dec. 15, 2010.

(51) Int. Cl.
*H03M 7/00* (2006.01)

(52) U.S. Cl.
USPC .............................................. 341/50; 341/51

(58) Field of Classification Search
USPC ........ 341/50, 53, 51; 375/260, 347, 267, 147, 375/240, 238, 257, 288, 295; 710/64, 65, 710/29
See application file for complete search history.

(56) References Cited

U.S. PATENT DOCUMENTS

| | | |
|---|---|---|
| 5,028,818 A | 7/1991 | Ang et al. |
| 5,032,743 A | 7/1991 | Rogers |
| 5,049,763 A | 9/1991 | Rogers |
| 5,061,864 A | 10/1991 | Rogers |
| 5,087,841 A | 2/1992 | Rogers |
| 5,149,991 A | 9/1992 | Rogers |
| 5,191,239 A | 3/1993 | Rogers |
| 5,199,002 A | 3/1993 | Ang et al. |
| 5,220,293 A | 6/1993 | Rogers |
| 5,228,106 A | 7/1993 | Ang et al. |
| 5,260,902 A | 11/1993 | Pilling et al. |
| 5,289,040 A | 2/1994 | Rogers |
| 5,300,832 A | 4/1994 | Rogers |
| 5,325,335 A | 6/1994 | Ang et al. |
| 5,355,032 A | 10/1994 | Rogers et al. |
| 5,371,425 A | 12/1994 | Rogers |
| 5,376,829 A | 12/1994 | Rogers et al. |
| 5,406,143 A | 4/1995 | Ang |
| 5,426,380 A | 6/1995 | Rogers |
| 5,510,733 A | 4/1996 | Rogers et al. |
| 5,548,620 A | 8/1996 | Rogers et al. |
| 5,592,370 A | 1/1997 | Rogers |
| 5,596,293 A | 1/1997 | Rogers et al. |
| 5,598,035 A | 1/1997 | Rusu et al. |
| 5,600,272 A | 2/1997 | Rogers |
| 5,629,613 A | 5/1997 | Marzolf et al. |

(Continued)

OTHER PUBLICATIONS

PCT International Search Report and Written Opinion for PCT/US2011/065293, mailed Mar. 30, 2012 (8 pgs.).

*Primary Examiner* — Joseph Lauture
(74) *Attorney, Agent, or Firm* — Blakely Sokoloff Taylor & Zafman LLP

(57) ABSTRACT

A method is described for encoding N variables onto less than 2N channels by forming a respective signal for each of the channels by combining inverted and/or non inverted forms of the variables, such that, each of the N variables is balanced across the channels, and, combination on any particular channel is not the polar opposite of a combination on any other channel.

29 Claims, 10 Drawing Sheets

(56) References Cited

U.S. PATENT DOCUMENTS

| | | |
|---|---|---|
| 5,642,325 A | 6/1997 | Ang |
| 5,668,765 A | 9/1997 | Ang |
| 5,675,298 A | 10/1997 | Bhagwan et al. |
| 5,781,781 A | 7/1998 | Marzolf et al. |
| 5,787,302 A | 7/1998 | Hampapuram et al. |
| 5,826,054 A | 10/1998 | Jacobs et al. |
| 5,852,741 A | 12/1998 | Jacobs et al. |
| 5,862,398 A | 1/1999 | Hampapuram et al. |
| 5,889,417 A | 3/1999 | Klass et al. |
| 5,942,918 A | 8/1999 | Ang et al. |
| 5,942,919 A | 8/1999 | Ang et al. |
| 5,973,547 A | 10/1999 | Ang et al. |
| 5,982,210 A | 11/1999 | Rogers |
| 5,983,013 A | 11/1999 | Rogers et al. |
| 6,018,254 A | 1/2000 | Rogers et al. |
| 6,028,417 A | 2/2000 | Ang et al. |
| 6,037,833 A | 3/2000 | Ang |
| 6,069,521 A | 5/2000 | Taylor et al. |
| 6,131,152 A | 10/2000 | Ang et al. |
| 6,198,325 B1 | 3/2001 | Ang et al. |
| 6,226,330 B1 * | 5/2001 | Mansur ................ 375/257 |
| 6,262,608 B1 | 7/2001 | O'Hearcain et al. |
| 6,281,714 B1 | 8/2001 | Ang et al. |
| 6,281,729 B1 | 8/2001 | Ang et al. |
| 6,294,924 B1 | 9/2001 | Ang et al. |
| 6,297,677 B1 | 10/2001 | Ang et al. |
| 6,301,146 B1 | 10/2001 | Ang et al. |
| 6,316,957 B1 | 11/2001 | Ang et al. |
| 6,339,351 B1 | 1/2002 | Ang et al. |
| 6,366,139 B1 | 4/2002 | Ang et al. |
| 6,411,131 B1 | 6/2002 | Ang et al. |
| 6,420,913 B1 | 7/2002 | Ang et al. |
| 6,462,623 B1 | 10/2002 | Horan et al. |
| 6,704,859 B1 | 3/2004 | Jacobs et al. |
| 7,039,885 B1 | 5/2006 | Mohan |
| 7,102,449 B1 | 9/2006 | Mohan |
| 2004/0181648 A1 | 9/2004 | Jacobs et al. |
| 2010/0219894 A1 | 9/2010 | Rogers |

* cited by examiner

MULTI-VARIABLE MULTI-WIRE INTERCONNECT

CLAIM TO PRIORITY

The present invention claims priority to and the benefit of the filing date of U.S. Provisional Application No. 61/423,532 filed on Dec. 15, 2010 entitled "Multi-Variable Multi-Wire Matrix Interconnect" which is also hereby incorporated by reference.

BACKGROUND

Figure 1:
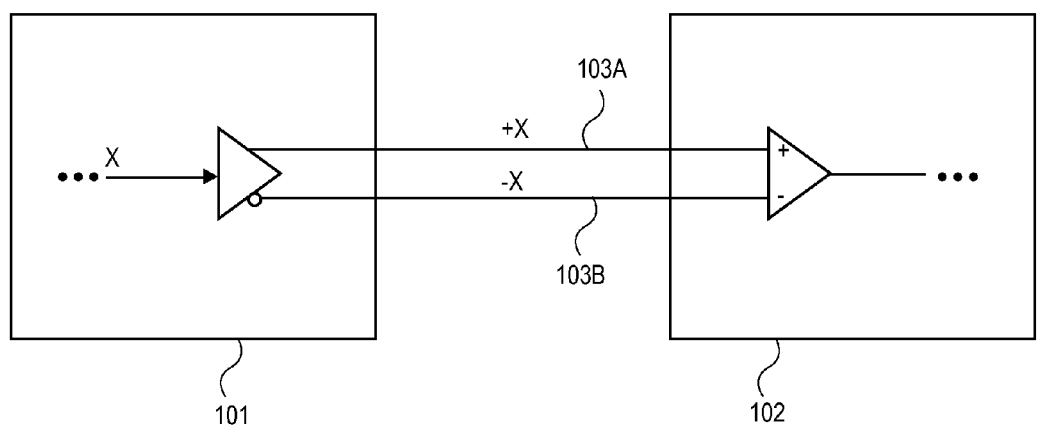

FIG. 1 shows a traditional differential signaling scheme. As observed in FIG. 1, a variable "x" is driven from the transmission side 101 to the reception side 102 as a differential signal having a positive polarity (+x) along a first channel 103a and a negative polarity (-x) along a second channel 103b. In the electronic arts, for bit stream variables at least, differential signals have been used to transport a variable at a high speed. Here, having both a positive polarity (+) and a negative polarity (-) boosts the signal-to-noise ratio (SNR) over and above a "single ended" transmission of the same variable (i.e. where just one sense is employed), while, at the same time reducing emitted electro-magnetic interference (EMI).

Qualitatively, the boost in SNR can be viewed as a consequence of the fact that two channels are used to transmit the same variable. In a manner of speaking, the "signal power" of the transmitted variable is increased. Because a minimally acceptable bit error rate (BER) is typically defined at a minimally acceptable SNR, and, because SNR degrades as the fundamental frequency of the transmission of the variable increases, the boost in SNR from the differential signaling corresponds to a higher achievable fundamental frequency of transmission for the variable (e.g., a higher bit rate speed).

Figure 2:
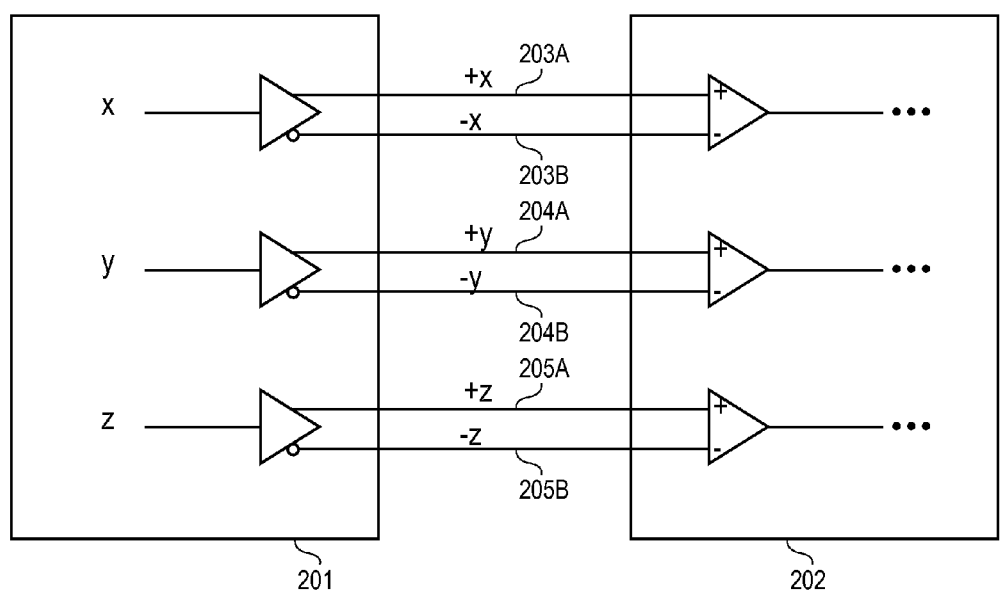

FIG. 2 shows an arrangement of multiple differential signals to transport a plurality of variables x, y, z. Multiple differential signals have been traditionally used to implement a high speed bus or high speed interface where multiple bit streamed variables x, y, z are to be simultaneously transported from a same transmission side 201 to a same reception side 202. The arrangement of FIG. 2 presents some problems, however.

A first problem is the number of channels needed to fully implement the high speed bus/interface. Specifically, 2N channels are needed to transport N variables. In the example of FIG. 2, N=3 (x, y and z correspond to three variables). Therefore there are 2N=2(3)=6 channels: 203a,b; 204a,b; 205a,b. In the electronic arts, each of the 2N channels corresponds to individual wires that must be routed from the transmission side 201 to the reception side 202. If N is large, the designer of the bus/interface is presented with an expensive (at least in terms of needed layout space) if not impossible wire routing challenge.

A second problem is that the SNR boost from the differential arrangement can be less than that for a single differential channel as described above with respect to FIG. 1. Here, if the respective channels for the multiple variables are proximate to one another (e.g., neighboring one another as observed in FIG. 2), which is apt to be the case if a large N has caused the designer to "pack" the individual channel wires close to one another, then, according to a phenomena known as "crosstalk", the signals associated with different uncorrelated variables can act as noise sources to each other. For example, the signals for variables x and z on channels 203a,b and 205a,b can act as noise on the channels 204a,b for variable y. The added noise effectively reduces the SNR boost described above for the differential scheme of FIG. 1.

FIGURES

Figure 3:
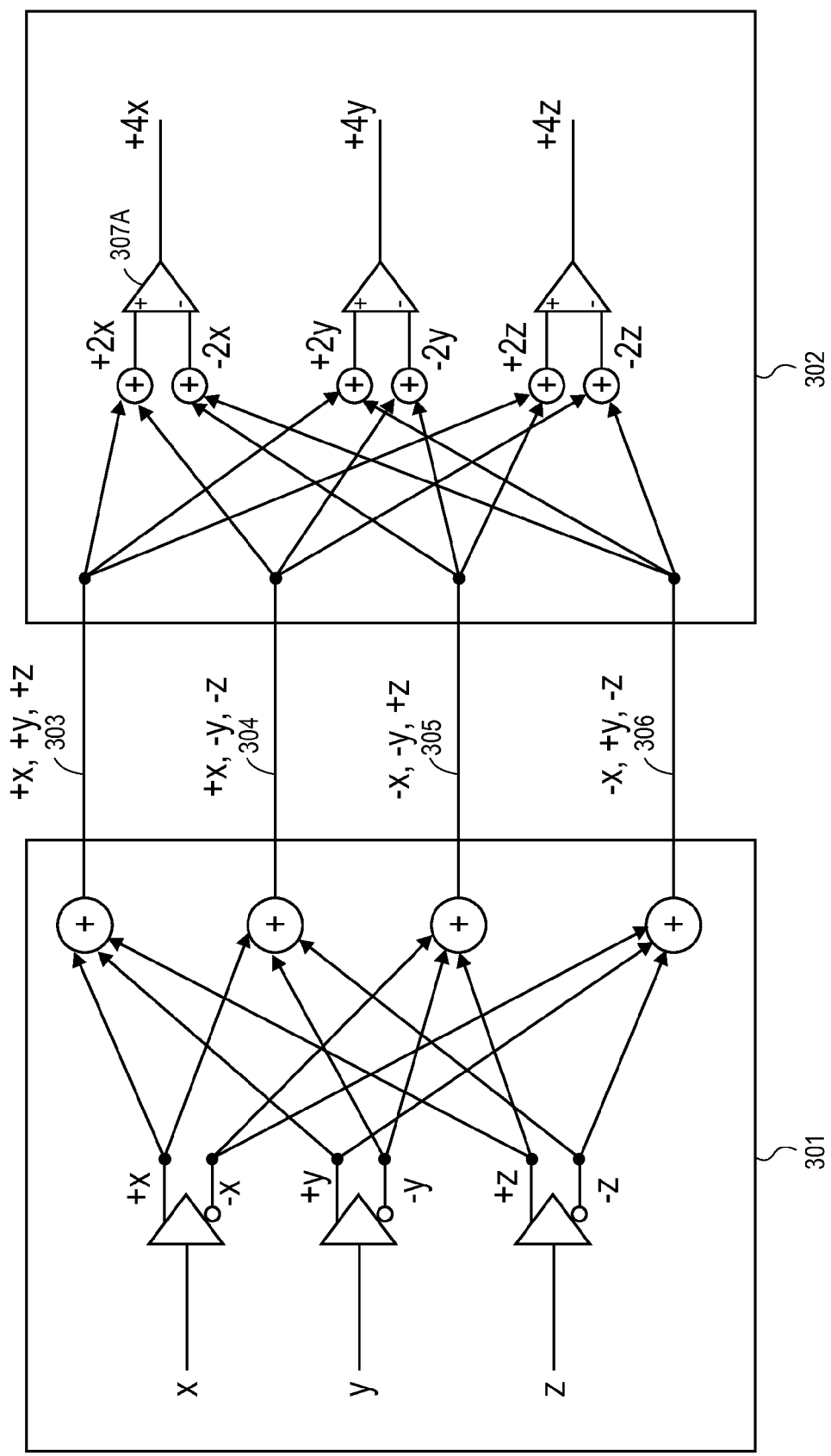
Figure 4A:
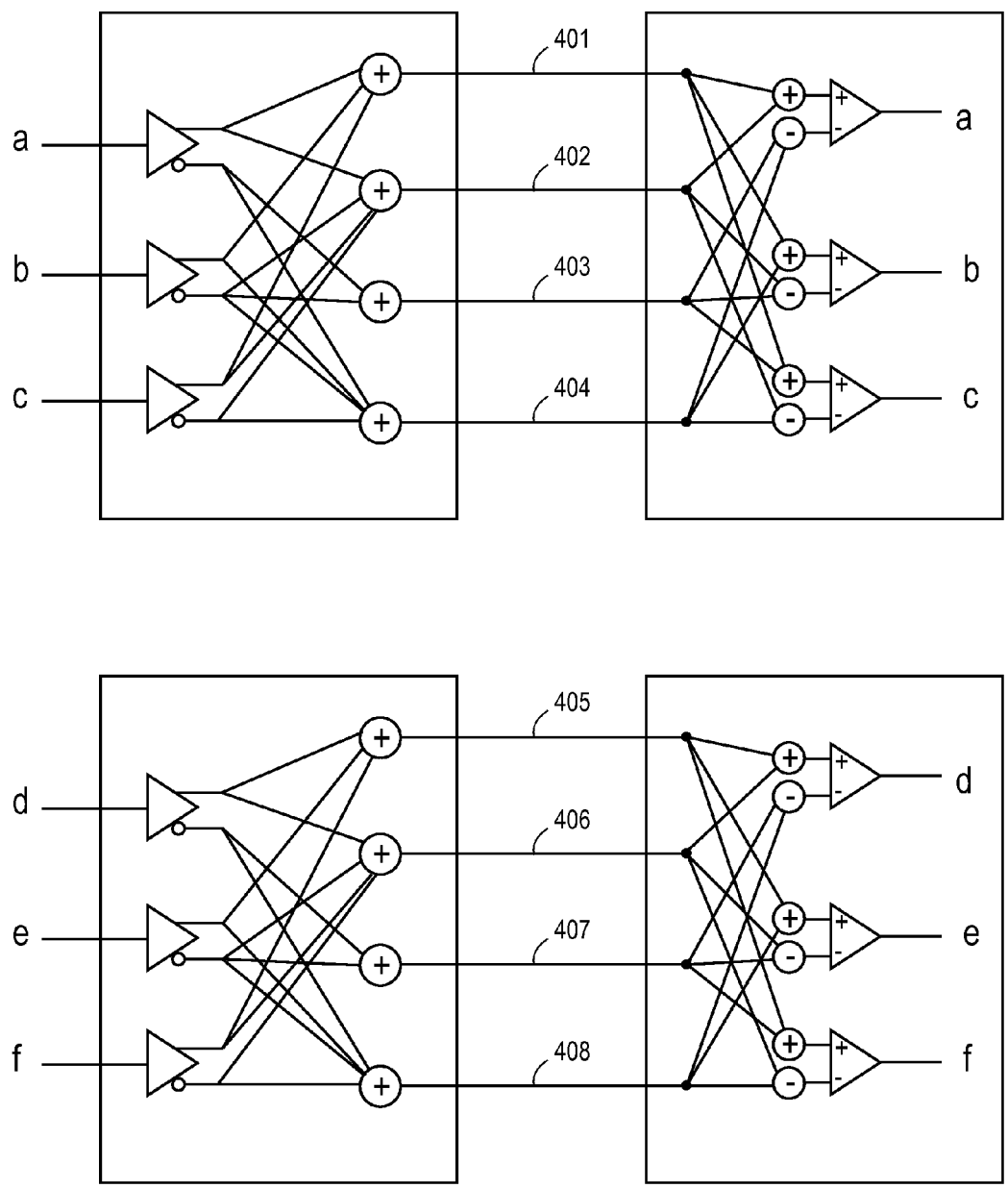
Figure 4B:
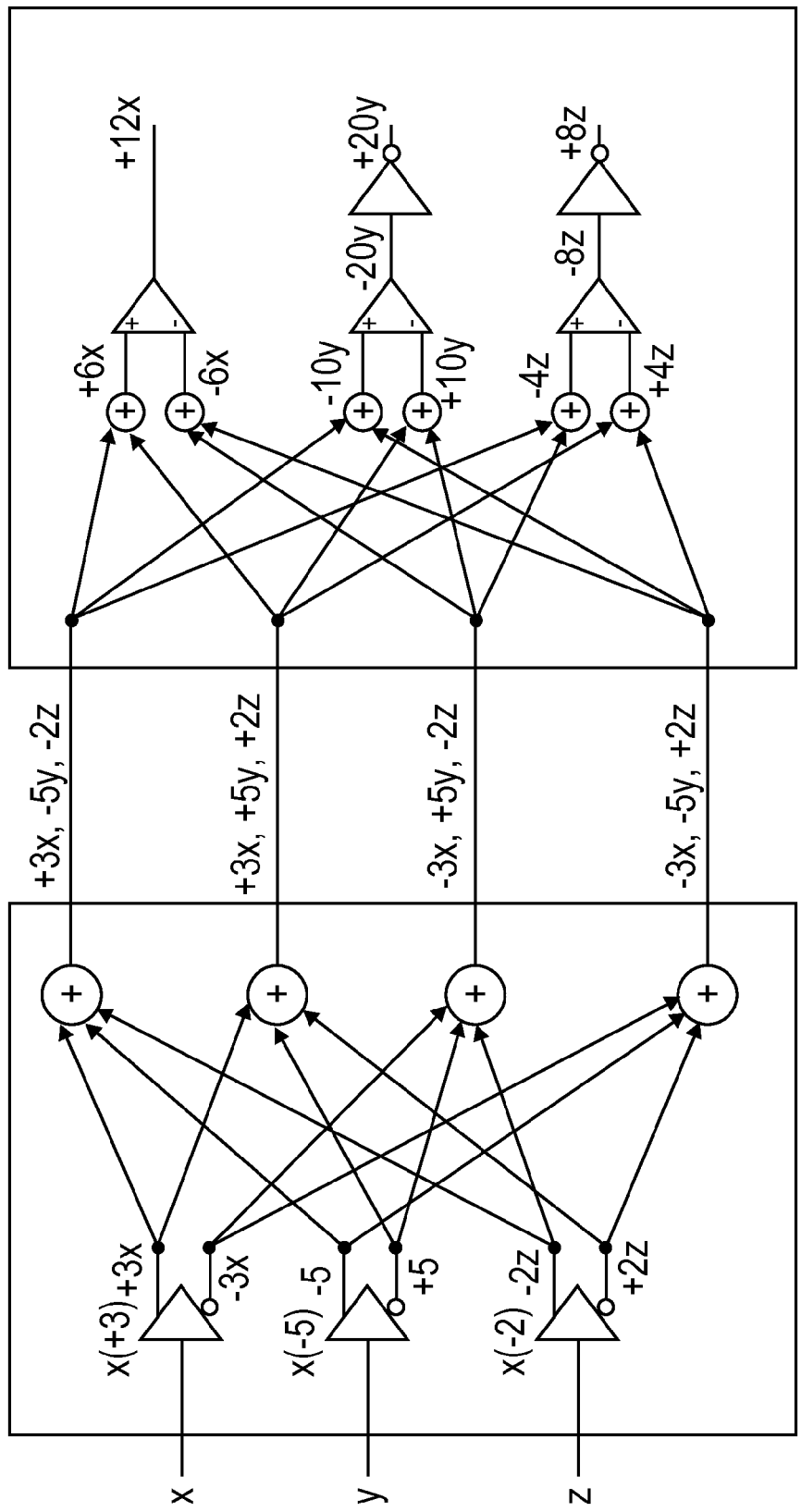
Figure 4C:
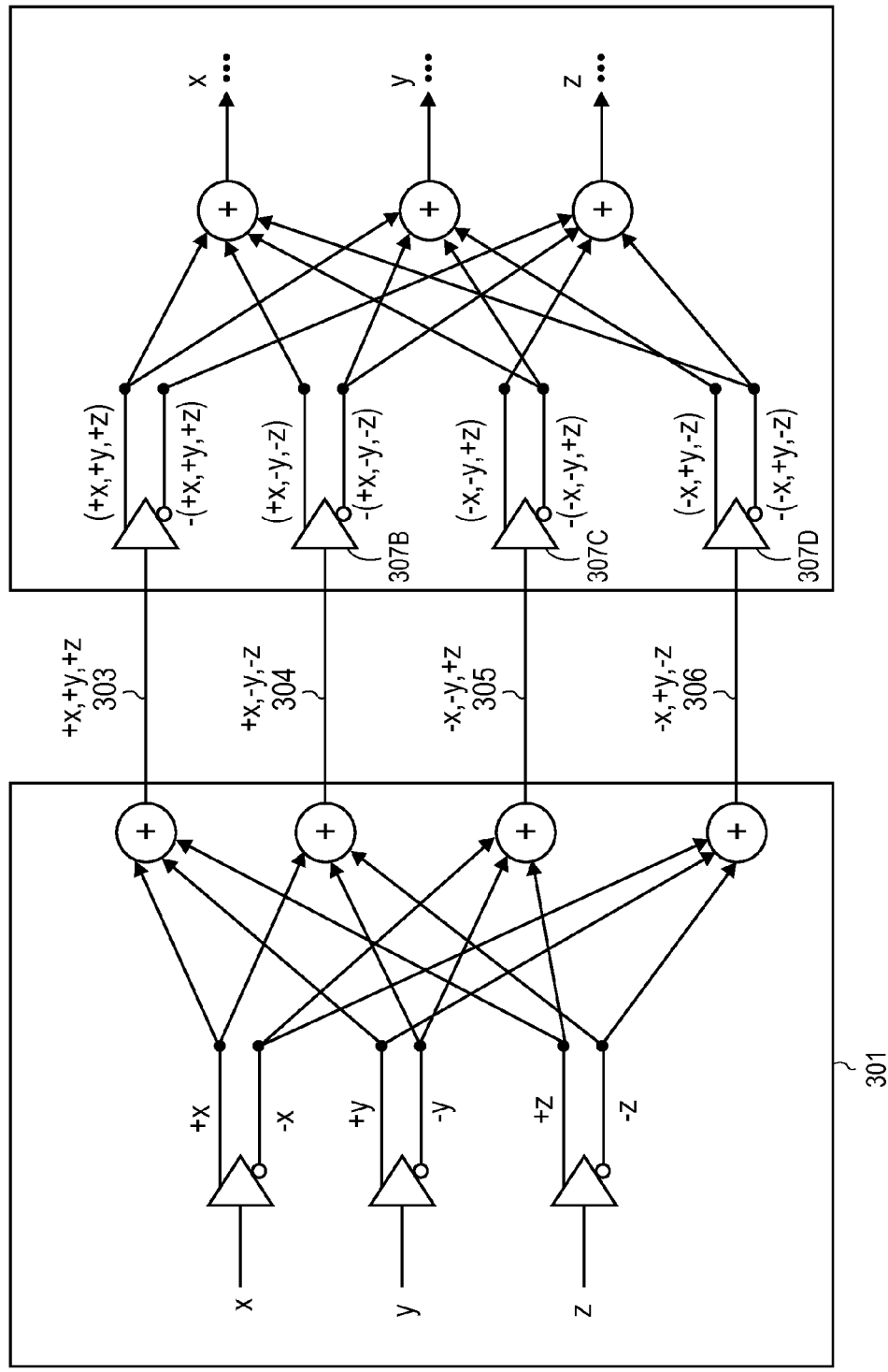
Figure 4D:
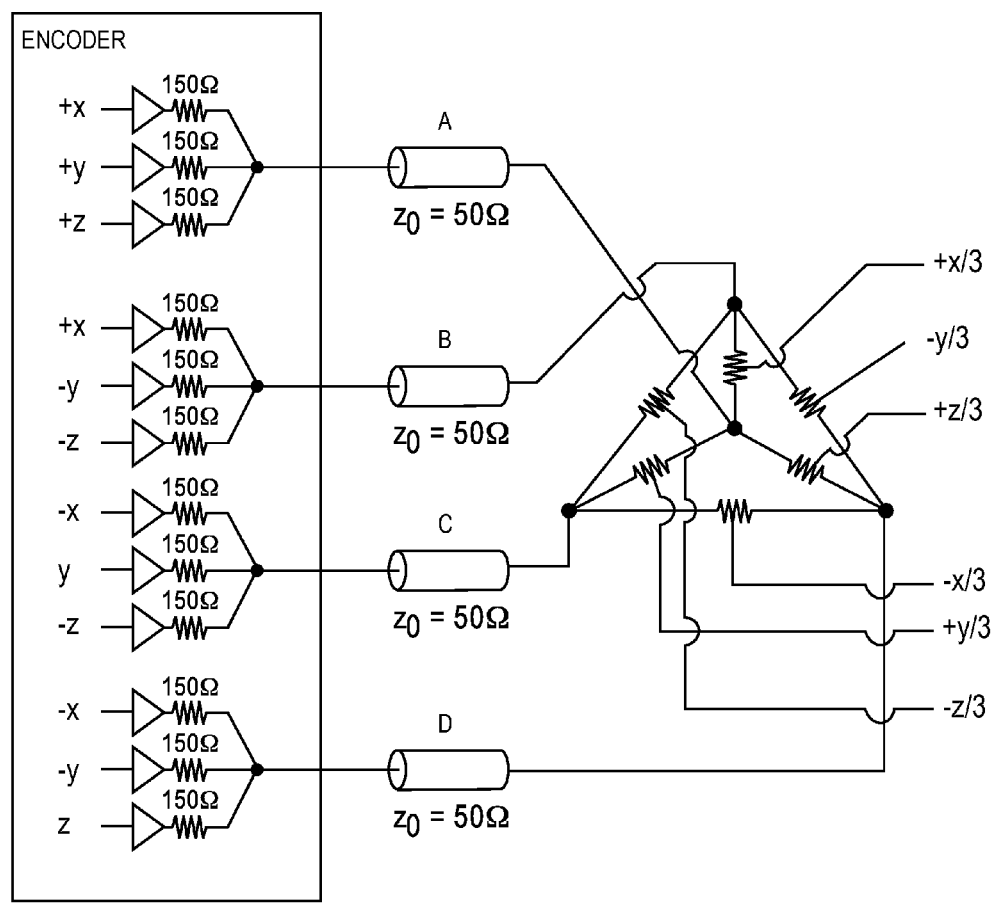
Figure 5:
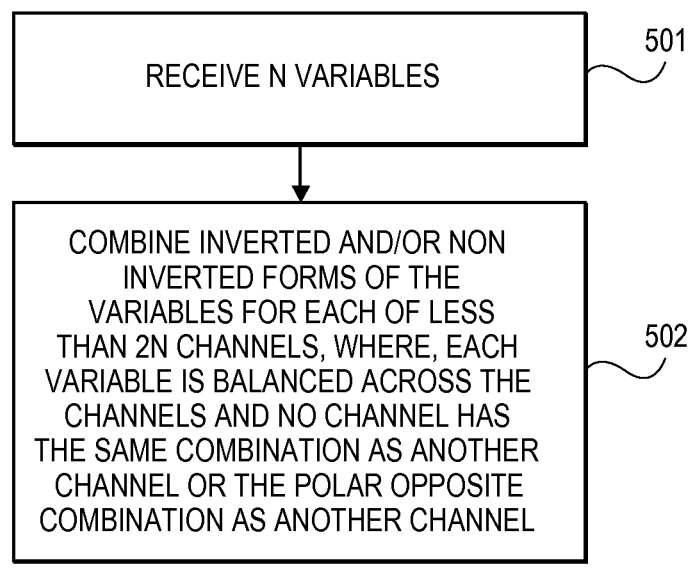
Figure 6:
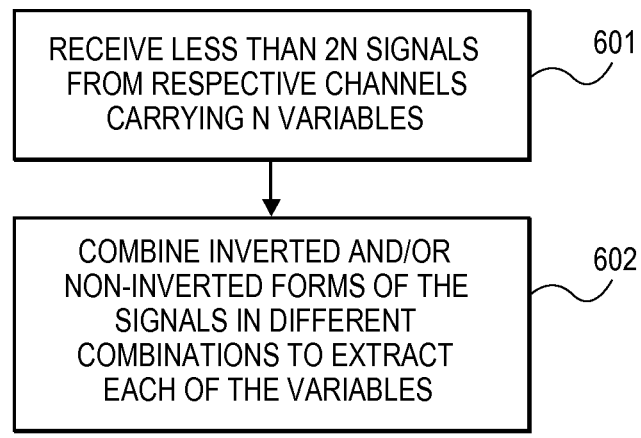
Figure 7:
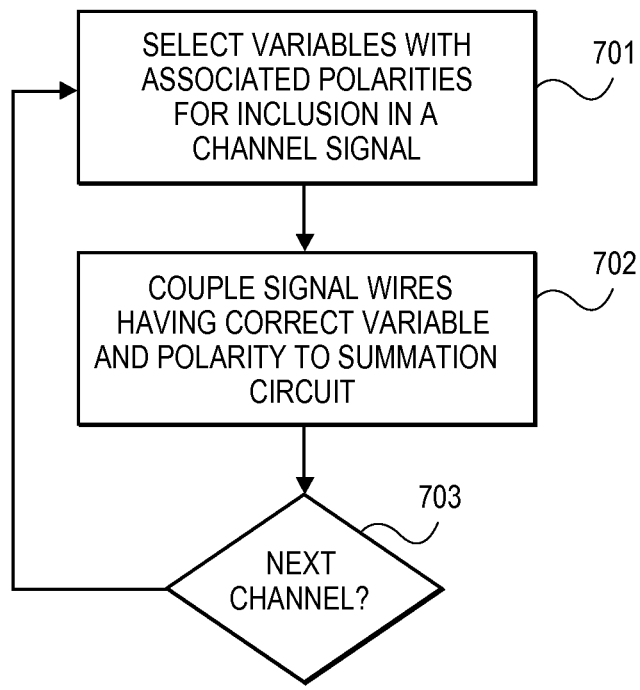

The present invention is illustrated by way of example and not limitation in the figures of the accompanying drawings, in which like references indicate similar elements and in which:

FIG. 1 shows a single differential channel;
FIG. 2 shows multiple differential channels;
FIG. 3 shows a first embodiment of an encoder and decoder;
FIG. 4a shows a second embodiment of an encoder and a decoder;
FIG. 4b shows a third embodiment of an encoder and decoder;
FIG. 4c shows a fourth embodiment of an encoder;
FIG. 4d shows a fifth embodiment of an encoder;
FIG. 5 shows an encoding process;
FIG. 6 shows a decoding process;
FIG. 7 shows a circuit design process;

DETAILED DESCRIPTION

FIG. 3 shows an improved approach for transmitting multiple variables across any transportation medium. As observed in FIG. 3, the number of channels needed to transport N variables is less than 2N. Moreover, because signals on neighboring channels are more correlated to one another than the traditional differential approach observed in FIG. 2, any crosstalk phenomena between channels can be characterized as the introduction of at least some additional signal component to a channel rather than pure noise.

Additionally, owing to the somewhat complex scheme by which the signals on the different channels are determined, the improved approach introduces a form of "scrambling" on the channels that corresponds to a natural form of encryption. As such, if an unwanted eavesdropper were to "snoop" the channels it would be difficult to reproduce the variables (which corresponds to the data or information) being transported.

According to the improved approach of FIG. 3, variables being transported are combined onto a same channel, where, the net polarity of any variable across all the channels is zero, and, for any specific combination of variables and their associated polarities on a particular channel, there does not exist on another channel the same combination of variables with perfectly opposite associated polarities. The example of FIG. 3 shows examples of these characteristics and each will be explained immediately below.

As observed in FIG. 3, an encoder 301 on a transmission side is presented with three variables for transmission x, y, z to a decoder 302 on a reception side. Here, an "encoder" is understood to be a physically implemented function that converts input variables to a different representation, and, the term "decoder" is understood to be a physically implemented function that receives the different representation and converts it back into the input variables. Also, a variable is a unit of communicated information. A variable may take any one of various forms such as an analog waveform or a digital waveform (e.g., a bit stream) including a multi-level logic waveform. Here, a waveform is understood to be a voltage or current over time. Analog waveforms tend to exhibit rounded waveform shapes while digital waveforms tend to have sharp rise/fall times between specific logic levels. A variable may also be realized as a byte stream or other binary data stream where discrete units of information are organized into multibit "words". A variable may be realized with any of various forms of electromagnetic radiation as well.

Conceivably, different waveform types (e.g., an analog waveform and a bit stream, analog waveforms of different peak-to-peak voltages, etc.) may be simultaneously processed by the same encoder and combined onto a same channel as described in more detail below. As such, the variables may correspond to signals that, before reaching the encoder, are encoded, modulated, or otherwise pre-processed in entirely different ways with respect to each other. Moreover, as discussed in more detail below, the encoder itself may introduce different levels of scaling and/or inversion to the input variables. The individual signal variables may not even need to be of the same amplitude, or frequency, or maintain any phase relationship with respect to each other. For example, an encoder that receives input variables x, y, z may scale x 3 times, y 5 times and z two times (3x, 5y, 2z) and/or change polarities of one or more of the same (e.g., 3x, −5y, −2z). As an initial point of discussion, however, FIG. 3 shows a basic example.

As observed in FIG. 3, the three variables x, y, z are processed by an encoder 301 that combines the positive and negative polarities of the various variables onto appropriate channels according to the encoding scheme. Notably, for the 3 variables observed in FIG. 3, only four channels 303, 304, 305 and 306 are utilized between the transmission and reception sides. Each channel can be driven by a respective transmitter (not shown) and terminated at the reception side by a corresponding receiver (not shown).

Recall that in a classic differential scheme as presented in FIG. 2, six channels are needed to transport three variables. Therefore the scheme of FIG. 3 shows a 33% channel savings as compared to the classic differential approach of FIG. 2.

The particular encoder 301 in the example of FIG. 3 is designed to select the following signaling scheme for the four channels:

Channel 303: +x, +y, +z
Channel 304: +x, −y, −z
Channel 305: −x, −y, +z
Channel 306: −x, +y, −z Here, as observed in the particular example of FIG. 3, the signal on each channel is created by combing (e.g., adding) variables, where, each selected variable is in inverted and/or non inverted form based on the channel scheme presented above.

Observing the signal selections, note that each of the variables is "balanced" over all the channels. That is, for each variable, the number of positive polarity signals is equal to the number of negative polarity signals. More specifically, at least in the particular example of FIG. 3, each variable has two positive polarity signals (e.g., variable x has +x signals on channels 303 and 304) and two negative polarity signals (e.g., variable x has −x signals on channels 305 and 306). Similar to the discussion provided in the Background with respect to FIG. 1, balancing boosts SNR and reduces EMI for each of the transported variables.

Besides each variable being balanced, note that each combination of variables on any channel has a unique polarity pattern, where, the uniqueness also eliminates its polar opposite. That is, for any specific combination of variables and their associated polarities on a particular channel, there does not exist on another channel the same combination of variables with perfectly opposite associated polarities. For example, noting that channel 303 carries the combination +x, +y, +z note that the combination −x, −y, −z (i.e., the polar opposite of the combination on channel 303) does not exist on any other channel.

The property of not presenting on any channel a polar opposite of a combination that exists on another channel permits straightforward decoding, as observed in decoder 311, and, can boost SNR in a manner above and beyond what is achievable with a traditional differential approach.

With respect to the decoder 302, note that the variable x is re-constructed by inverting the signals on channels 305, 306 and combining them with the other non inverted channels 303, 304 (by way of differential amplifier 307a). Specifically, the re-construction can take the form of:

$$\frac{\begin{array}{ll} +x, +y, +z & +x, +y, +z \\ +x, -y, -z & +x, -y, -z \\ -(-x, -y, +z) & +x, +y, -z \\ + \; -(-x, +y, -z) & + \; +x, -y, +z \end{array}}{} = \frac{+x, -y, +z}{+4x, 0, 0}$$

From the above analysis, note that the variable x is precisely reconstructed while variables y and z cancel out. Here, the factor of 4 corresponds to the original signal strength emitted from the encoder 301. The other variables are reconstructed the same way with the same results.

In the example of FIG. 3, each variable being transported is represented on every channel. Although perhaps a preferable approach, it is not a required one. FIG. 4a shows an embodiment where less than all of the variables to be transported across the channel are represented on each channel. Here, the same scheme presented above for FIG. 3 is repeated for different variable subsets of the set of total variables. Specifically, a first subset of the variables (a,b,c) is assigned to a first subset of the channels 401, 402, 403, 404 and a second subset of the variables (d,e,f) is assigned to a second subset of the channels 405, 406, 407, 408. Notably, the first subset of variables is mutually exclusive from the second subset of variables, and, the first subset of channels is mutually exclusive from the second subset of channels.

Also, as mentioned above, the encoder may introduce various degrees of scaling and inversion to the variables that it encodes. For example, FIG. 4b shows another encoder example for comparison against the encoder 301 of FIG. 3. Specifically, the encoder of FIG. 4b scales variable x by +3, scales variable y by −5 and scales variable z by −2. With compensatory scaling and inversion in the decoder side, the original variables x, y, z can be precisely reconstructed. Note that some input variables may be inverted while others need not be. Likewise, any applied scaling to the input variables need not be the same for each variable. The condition of canceling signal power for any individual variable across all the channels is still met. Note that a scalar of 0 can still be workable, FIG. 4a presents a form of zero scaling (input variables a, b, c have scalar=0 on channels 405-408).

Another way of viewing the feature of having various degrees of scaling and inversion is that encoded signals may be mixed. For instance, when combining two signals, A and B, signal A may be added to signal B to create a new signal A+B. In a more general form any proportional combination signal could be created, nA+mB where n and m are constants. In various embodiments popular constants are n=1, m=1 on one channel, and n=1, m=−1 on another, so A+B exists on one channel, and A−B exists on another. It is pertinent to note however that the values of n and m may be different.

Moreover, note that the decoder 302 of FIG. 3 is essentially symmetrical to the encoder 301. That is, as the encoder includes adders between the channels and differential drivers, correspondingly, the decoder includes adders between the channels and the differential receivers. Although perhaps a desirable feature in many applications it is not a strict requirement. For example, FIG. 4c shows an alternate decoder embodiment that mathematically will reconstruct the input variables x, y, z from channels 304, 305, 306, 307 of FIG. 3, yet, by contrast, includes linear single-ended-to-differential receivers between the channels and the adders.

FIG. 4d shows a pure passive analog version of the encoder where resistances act as adders. An implementation such as the implementation observed in FIG. 4d, although capable of being implemented on a semiconductor chip, need not be. For example, the encoder example of FIG. 4d can be implemented on a PC board. In the exemplary encoder of FIG. 4d, each discrete variable form that is driven onto a channel has its own driver with a 150 ohm source impedance. Thus, the addition of three variable forms per channel as observed in FIG. 4d results in impedance matching to a channel with a 50 ohm characteristic impedance. An exemplary resistor network that can effect the proper termination is also observed in FIG. 4d on the decoder side. Each resistance is 225 ohms and the reconstructed signals are center tapped.

FIG. 5 shows an encoding process that can be performed by an encoder to encode signals on various channels consistent with the descriptions above. According to the encoding process observed in FIG. 5, N variables are received 501. Combinations of inverted and/or non-inverted forms of the variables are combined (e.g., added) for each of less than 2N channels such that no other channel has the same combination or a polar opposite combination, and, each variable is balanced across all the channels 502.

FIG. 6 shows a decoding process by which N variables are received 601 from less than 2N channels where each respective signal corresponds to a different combination of inverted and/or non-inverted forms of the variables and where each variable is balanced across all the channels and no channel has an identical combination as another channel or the polar opposite combination as another channel. A variable is reconstructed by combining inverted forms of signals received on a first group of channels with the non-inverted forms of signals received on a second group of channels 602. In an embodiment, the polarity of a specific variable to be extracted is the same for the signals in the first group, and, is the opposite for the signals in the second group. This enhances the signal strength of the variable to be extracted and cancels out the other variables.

The encoder and decoder can be implemented with respective electro-magnetic, optic or electronic circuitry disposed on any of a semiconductor chip, printed circuit board, electro-optic medium or electromagnetic medium. Any circuitry may be logic circuitry, analog circuitry or a mixture thereof ("mixed signal"). In the case where analog waveforms are added by an encoder or decoder, the summation may be implemented with a, passive or active resistor network (e.g., the summation appears on a node that is coupled to the different waveforms to be added through a dedicated resistance to each waveform), or alternatively through current or charge summing. If the variables to be added are streams of digital words the addition can be performed with a logic adder or alternatively with active or passive scalers and/or summers.

The encoder and decoder may be implemented with custom or standard cell electronic circuitry that crafts the appropriate signals, or, may be implemented with programmable circuitry such as general purpose processor of digital signal processor.

In the case where program code and a processor is used to implement the encoder, the processing of the program code by the processor combines, according to the encoding scheme, digital words representing the variables (or samples of waveforms of the variables) that are stored in memory. The resultant signals are expressed as digital words and may also be stored back in memory. The resultant may be transmitted/transported in this form (e.g., as data stored in a data file). Alternatively, the digital words may be further processed by a signal processing flow that includes one or more digital-to-analog converters (e.g., one digital-to-analog converter for each channel) that creates waveforms prior to transmission.

In the case where program code and a processor is used to implement the decoder, the processing of the program code by the processor combines, according to the decoding scheme, digital words representing the signals received on the channels (or samples of waveforms representing these signals) that are stored in memory. Analog-to-digital conversion may precede the storing of the digital words into the memory. The extracted variables are expressed as digital words and may also be stored back in memory.

The transmission medium between the transmission side and the reception side may be any transmission medium including electronic wiring, an air medium or a fiber optic medium. In the case of electronic wiring, the transmission and reception sides may exist on a same semiconductor chip, in which case the channels are implemented with the interconnect wiring of the semiconductor chip. Alternatively the transmission and reception sides may exist on different semiconductor chips in which case the channels are implemented with chip-to-chip interconnect wiring (e.g., conductive traces disposed on a PC board).

In the case of an air medium, each channel may be effected with a specific modulation technique and/or carrier frequency that permits the reception side to discern the signaling specific to a particular channel. Corresponding circuitry would be imposed in the transmission side and reception side. The transmission and reception sides may be implemented with respective semiconductor chips.

In the case of a fiber optic approach, the individual channels may be multiplexed onto a single fiber optic cable (e.g., with wavelength division multiplexing (WDM)), or, each channel may correspond to a separate fiber optic cable, or some combination of these approaches may be utilized (e.g., multiple cables connect the transmission side to the reception side but the cables support multiple channels, e.g., by WDM).

Embodiments of encoder and/or decoder circuitry may be embodied as circuit designs stored on a computer readable medium (such as a CD, disk drive or non volatile memory device). Here, as is known in the art, a circuit may be designed by compiling or synthesizing a description of the circuit through continuously enhanced levels of detail. Behavioral features may be defined at higher levels of detail (such as high level VHDL or Verilog descriptions). Circuit descriptions having intermediate levels of detail include RTL netlists and gate-level netlists. Circuit descriptions with high levels of detail include transistor level netlists and lithographic mask files. Any of the above correspond to a circuit description.

FIG. 7 shows a design methodology for designing an encoder that can implement an encoding process according to the teachings above. The process of FIG. 7 can be implemented, for example, with computer aided design (CAD) software directed to synthesizing circuit descriptions. According to the methodology of FIG. 7, the process selects variables for inclusion in a channel 701 and checks the selected combination against previous combinations of variables that have already been committed for a channel. If the selected combination does not correspond to the polar opposite of any of the committed combinations the selected combination is committed for a next channel. For each variable in the committed combination for a channel, representations of signal wires or nodes (e.g., "nets") having the selected inverted or non inverted form of the variable are coupled, linked, and/or routed to a summation circuit. The process repeats for a next channel 703.

According to one embodiment, a sufficient number of channels is reached when each of N variables (whether inverted or non inverted) is carried on more than two channels (e.g., each variable is carried on at least four, six, eight, channels, etc.), the chosen polarities of each variable on the channels result in each variable being balanced across the channels, and, the total number of channels is less than 2N. In the case of a decoder design process (not shown), corresponding signals of inverted and non inverted forms of the signals received from the channels are coupled/linked/routed to a summation circuit for each variable in accordance with the encoding scheme implemented on the encoder side so that the variable can be extracted.

It is believed that processes taught by the discussion above may be described in source level program code in various object-orientated or non-object-orientated computer programming languages (e.g., Java, C#, VB, Python, C, C++, J#, APL, Cobol, Fortran, Pascal, Perl, etc.) supported by various software development frameworks. The source level program code may be converted into an intermediate form of program code (such as Java byte code, Microsoft Intermediate Language, etc.) that is understandable to an abstract execution environment (e.g., a Java Virtual Machine, a Common Language Runtime, a high-level language virtual machine, an interpreter, etc.) or may be compiled directly into object code.

A machine readable storage medium may be used to store program code and/or the information used and/or created by processing program code. A machine readable medium may be embodied as, but is not limited to, one or more memories (e.g., one or more flash memories, random access memories (static, dynamic or other)), optical disks, CD-ROMs, DVD ROMs, EPROMs, EEPROMs, magnetic or optical cards or other type of machine-readable media suitable for storing electronic instructions. Program code and/or the data used by and/or created by program code may also be downloaded from a remote computer (e.g., a server) to a requesting computer (e.g., a client) by way of data signals embodied in a propagation medium (e.g., via a communication link (e.g., a network connection)).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
   an encoder comprising electronic circuitry to craft, from N received input variables, respective channel signals for each of less than 2N channels, said channel signals composed of different combinations of inverted and/or non inverted forms of said variables, where, each of said variables is balanced across the channels, and, a combination on any particular channel is not the polar opposite of a combination on any other channel, and wherein said forms for at least two different ones of said variables have different amplitudes.

2. The apparatus of claim 1 wherein the channels are implemented with electronic wiring.

3. The apparatus of claim 1 wherein the electronic wiring interconnects two different semiconductor chips.

4. The apparatus of claim 1 wherein said electronic circuitry includes a processor that executes program code that determines each channel's combination.

5. The apparatus of claim 1 wherein the channels are implemented over an air medium.

6. The apparatus of claim 1 wherein the channels are implemented with one or more fiber optic cables.

7. The apparatus of claim 1 wherein said encoder further comprises respective signal lines for said inverted and non inverted forms of said N variables, said encoder further comprising an adder for each of said channels to add respective signals of said signal lines consistent with the channel's specific combination.

8. The apparatus of claim 1 wherein a first subset of said variables is assigned to a first subset of said channels and a second subset of said variables is assigned to a second subset of said channels, where, said first subset of said variables is mutually distinct from said second subset of said variables, and, said first subset of said channels is mutually distinct from said second subset of said channels.

9. A method, comprising:
   encoding N variables onto less than 2N channels by:
   forming a respective signal for each of said channels by combining inverted and/or non inverted forms of said variables, such that, each of the N variables is balanced across the channels, and, a combination on any particular channel is not the polar opposite of a combination on any other channel and wherein said forms for at least two different ones of said variables have different amplitudes.

10. The method of claim 9 further comprising transmitting each of said channels' respective signals to a reception side.

11. The method of claim 10 wherein said transmitting further comprises transmitting said signals over one of: a), b), c) below
   a) a plurality of wires;
   b) an air medium;
   c) one or more fiber optic cables.

12. The method of claim 9 further comprising, at said reception side, decoding said variables from said signals, said decoding including adding a first set of said signals with an inverted form of a different set of said signals.

13. The method of claim 12 wherein said adding cancels out unwanted ones of said variables and boosts signal strength for a particular wanted one of said variables.

14. A method, comprising:
   decoding N variables from less than 2N channels, each of the less than 2N channels transporting different signals composed of different combinations of inverted and/or non inverted forms of said variables and where said forms for at least two different ones of said variables have different amplitudes, where each of said N variables is balanced across said channels and where a combination on any particular channel is not the polar opposite of a combination on any other channel, said decoding including adding different combinations of inverted and non inverted forms of said signals to extract said N variables.

15. The method of claim 14 wherein said method is performed with analog or mixed signal circuitry.

16. The method of claim 14 wherein said method is performed with program code processed on a processor.

17. A computer readable storage medium containing a description of a circuit, said circuit comprising:

an encoder to craft, from N received input variables, respective channel signals for each of less than 2N channels, said channel signals composed of different combinations of inverted and/or non inverted forms of said variables, where, each of said variables is balanced across said channels, and, and where a combination on any particular channel is not the polar opposite of a combination on any other channel, and wherein said forms for at least two different ones of said variables have different amplitudes.

18. The computer readable storage medium of claim 17 wherein said description is in the form of any of: a VHDL description, a Verilog description, a netlist.

19. The computer readable storage medium of claim 17 wherein said circuit is an analog or mixed signal circuit.

20. A computer readable storage medium containing a description of a circuit, said circuit comprising:
a decoder having inputs to couple to less than 2N channels that transport N variables, where, respective signals on said channels are composed of different combinations of inverted and/or non inverted forms of said variables and where said forms for at least two different ones of said variables have different amplitudes and where each of said N variables is balanced across said channels, said decoder having respective adders for each of said variables, each of said adders coupled to a different combination of inverted and non inverted forms of said signals.

21. The computer readable storage medium of claim 20 wherein said description is in the form of any of: a VHDL description, a Verilog description, a netlist.

22. The computer readable storage medium of claim 21 wherein said circuit is an analog or mixed signal circuit.

23. A computer readable storage medium containing a description of a circuit, said circuit comprising:
an encoder to craft, from N received input variables, respective channel signals for each of less than 2N channels, said channel signals composed of different combinations of inverted and/or non inverted forms of said variables, where, each of said variables is balanced across said channels, and, and where a combination on any particular channel is not the polar opposite of a combination on any other channel, and wherein said forms for at least two different ones of said variables have different frequencies and/or different phases.

24. The computer readable storage medium of claim 23 wherein said description is in the form of any of: a VHDL description, a Verilog description, a netlist.

25. The computer readable storage medium of claim 23 wherein said circuit is an analog or mixed signal circuit.

26. An apparatus, comprising:
an encoder to craft, from N received input variables, respective channel signals for each of less than 2N channels, said channel signals composed of different combinations of inverted and/or non inverted forms of said variables, where, each of said variables is balanced across said channels, and, and where a combination on any particular channel is not the polar opposite of a combination on any other channel, and wherein said forms for at least two different ones of said variables have different frequencies and/or different phases.

27. The apparatus of claim 26 wherein said encoder is implemented as an analog or mixed signal circuit.

28. An apparatus, comprising:
a decoder having inputs to couple to less than 2N channels that transport N variables, where, respective signals on said channels are composed of different combinations of inverted and/or non inverted forms of said variables and where said forms for at least two different ones of said variables have different frequencies and/or phases and where each of said N variables is balanced across said channels, said decoder having respective adders for each of said variables, each of said adders coupled to a different combination of inverted and non inverted forms of said signals.

29. The apparatus of claim 28 wherein said decoder is implemented as an analog or mixed signal circuit.

* * * * *